(12) United States Patent
Zhang et al.

(10) Patent No.: US 12,379,409 B2
(45) Date of Patent: Aug. 5, 2025

(54) ELECTROMAGNETIC ENVIRONMENT EVALUATION SYSTEM FOR CIVIL AIRPORT AND AVIATION STATION

(71) Applicant: CIVIL AVIATION FLIGHT UNIVERSITY OF CHINA, Sichuan (CN)

(72) Inventors: Xianhao Zhang, Guanghan (CN); Jing Mou, Guanghan (CN); Shuoling Xiang, Guanghan (CN); Weiqi Feng, Guanghan (CN); Yuwen Huang, Guanghan (CN); Qiang Fu, Guanghan (CN)

(73) Assignee: CIVIL AVIATION FLIGHT UNIVERSITY OF CHINA, Sichuan (CN)

( * ) Notice: Subject to any disclaimer, the term of this patent is extended or adjusted under 35 U.S.C. 154(b) by 315 days.

(21) Appl. No.: 18/035,448

(22) PCT Filed: Oct. 25, 2021

(86) PCT No.: PCT/CN2021/125992
§ 371 (c)(1),
(2) Date: May 4, 2023

(87) PCT Pub. No.: WO2022/095737
PCT Pub. Date: May 12, 2022

(65) Prior Publication Data
US 2024/0019479 A1    Jan. 18, 2024

(30) Foreign Application Priority Data

Nov. 5, 2020 (CN) .......................... 202011225148.7

(51) Int. Cl.
*G01R 31/00* (2006.01)
*G08B 21/18* (2006.01)

(52) U.S. Cl.
CPC .......... *G01R 31/001* (2013.01); *G01R 31/00* (2013.01); *G08B 21/18* (2013.01)

(58) Field of Classification Search
None
See application file for complete search history.

(56) References Cited

FOREIGN PATENT DOCUMENTS

| CN | 109557384 A | * | 4/2019 | ......... G01R 29/0892 |
| CN | 110493577 A | * | 11/2019 | |

* cited by examiner

*Primary Examiner* — Ladimir Magloire
*Assistant Examiner* — Ashley Brown Raynal
(74) *Attorney, Agent, or Firm* — Bochner PLLC; Andrew Bochner; Eric Kleinertz

(57) ABSTRACT

The present disclosure provides an electromagnetic environment evaluation system for a civil airport and an aviation station. An integrated transport hub, air-rail intermodality, and rail transit cause relatively strong electromagnetic interference to a navigation station. A high voltage transmission line and a communications base station also cause relatively strong electromagnetic interference to the navigation station. A large charging pile and other industrial, scientific, and medical (ISM) devices next to the airport cause electromagnetic interference to a navigation device in the airport. In the present disclosure, such interference is detected. If an interference determining apparatus determines that there is an anomaly after performing first interference determining, the interference determining apparatus performs second interference determining to avoid that subsequent actions are incorrect due to accidental data errors of the interference determining apparatus, and further reduce an error rate.

10 Claims, 2 Drawing Sheets

ELECTROMAGNETIC ENVIRONMENT EVALUATION SYSTEM FOR CIVIL AIRPORT AND AVIATION STATION

CROSS REFERENCE TO RELATED APPLICATION

This patent application is a national stage application of International Patent Application No. PCT/CN2021/125992, filed on Oct. 25, 2021, which claims the benefit and priority of Chinese Patent Application No. 2020112251487, filed with the China National Intellectual Property Administration on Nov. 5, 2020, the disclosure of which is incorporated by reference herein in its entirety as part of the present application.

TECHNICAL FIELD

The present disclosure belongs to the technical field of aviation safety, and in particular, relates to an electromagnetic environment evaluation system for a civil airport and an aviation station.

BACKGROUND

Civil aviation navigation devices are very important devices used to ensure aviation safety, including an instrument landing system (ILS), a very high frequency omnidirectional range (VOR), distance measuring equipment (DME), and a non-directional beacon (NDB). The ILS provides flight path, glide path, and distance guidance information for an aircraft during landing, such that the aircraft can safely land on a runway. The VOR provides a magnetic azimuth of the aircraft relative to a ground VOR, to ensure entry and exit of the aircraft, implement positioning based on a straight line of position, and ensure that the aircraft flies along a route. The VOR can also be used as an auxiliary device of the ILS to ensure safe landing of the aircraft.

Currently, electromagnetic environments around a navigation station are mainly as follows: An integrated transport hub, air-rail intermodality, and rail transit cause relatively strong electromagnetic interference to the navigation station. A high voltage transmission line and a communications base station also cause relatively strong electromagnetic interference to the navigation station. A large charging pile and other industrial, scientific, and medical (ISM) devices next to an airport cause electromagnetic interference to a navigation device in the airport. Whether these electromagnetic environments have impact on the navigation station must be determined at a current stage. A health status of the navigation station that is in an assessed low-impact electromagnetic environment for a long time also needs to be monitored in real time.

Therefore, an electromagnetic environment evaluation system for a civil airport and an aviation station needs to be designed at the current stage to resolve the foregoing problems.

SUMMARY

Technical Problem

The present disclosure provides an electromagnetic environment evaluation system for a civil airport and an aviation station to resolve the foregoing technical problems in the prior art. For example, currently, electromagnetic environments around a navigation station are mainly as follows: An integrated transport hub, air-rail intermodality, and rail transit cause relatively strong electromagnetic interference to the navigation station. A high voltage transmission line and a communications base station also cause relatively strong electromagnetic interference to the navigation station. A large charging pile and other ISM devices next to an airport cause electromagnetic interference to a navigation device in the airport. Whether these electromagnetic environments have impact on the navigation station must be determined at a current stage. A health status of the navigation station that is in an assessed low-impact electromagnetic environment for a long time also needs to be monitored in real time.

Solution to the Problem

Technical Solution

To achieve the above objective, the present disclosure adopts the following technical solution:

An electromagnetic environment evaluation system for a civil airport and an aviation station includes a first electromagnetic environment detection apparatus, a second electromagnetic environment detection apparatus, and a third electromagnetic environment detection apparatus.

The first electromagnetic environment detection apparatus is configured to detect first electromagnetic interference information caused to a navigation station by an integrated transport hub, air-rail intermodality, and rail transit.

The second electromagnetic environment detection apparatus is configured to detect second electromagnetic interference information caused to the navigation station by a high voltage transmission line and a communications base station.

The third electromagnetic environment detection apparatus is configured to detect third electromagnetic interference information caused to the navigation station by a large charging pile and an ISM device.

The system may further include a standard electromagnetic interference information storage apparatus and an electromagnetic interference determining apparatus.

The standard electromagnetic interference information storage apparatus is configured to store first standard electromagnetic interference information, second standard electromagnetic interference information, and third standard electromagnetic interference information.

The first standard electromagnetic interference information is electromagnetic interference information caused by the integrated transport hub, air-rail intermodality, and rail transit to the navigation station such that the navigation station can normally work.

The second standard electromagnetic interference information is electromagnetic interference information caused by the high voltage transmission line and communications base station to the navigation station such that the navigation station can normally work.

The third standard electromagnetic interference information is electromagnetic interference information caused by the large charging pile and ISM device to the navigation station such that the navigation station can normally work.

The first electromagnetic environment detection apparatus, the second electromagnetic environment detection apparatus, the third electromagnetic environment detection apparatus, and the standard electromagnetic interference information storage apparatus are connected to the electromagnetic interference determining apparatus.

The electromagnetic interference determining apparatus uses the first electromagnetic interference information and the first standard electromagnetic interference information to perform first primary interference determining in a primary interference determining unit. If a first primary interference determining result is that the first electromagnetic interference information matches the first standard electromagnetic interference information, the first primary interference determining result is used as an actual interference determining result of the first electromagnetic interference information; or if the first primary interference determining result is that the first electromagnetic interference information does not match the first standard electromagnetic interference information, the first primary interference determining result is temporarily stored. The electromagnetic interference determining apparatus uses the first electromagnetic interference information and the first standard electromagnetic interference information to perform second secondary interference determining in a secondary interference determining unit. If a second secondary interference determining result is that the first electromagnetic interference information matches the first standard electromagnetic interference information, the second secondary interference determining result is used as the actual interference determining result of the first electromagnetic interference information, and the first primary interference determining result is discarded; or if the second secondary interference determining result is that the first electromagnetic interference information does not match the first standard electromagnetic interference information, the first primary interference determining result is used as the actual interference determining result of the first electromagnetic interference information, and the second secondary interference determining result is discarded.

The electromagnetic interference determining apparatus uses the second electromagnetic interference information and the second standard electromagnetic interference information to perform first primary interference determining in the primary interference determining unit. If a first primary interference determining result is that the second electromagnetic interference information matches the second standard electromagnetic interference information, the first primary interference determining result is used as an actual interference determining result of the second electromagnetic interference information; or if the first primary interference determining result is that the second electromagnetic interference information does not match the second standard electromagnetic interference information, the first primary interference determining result is temporarily stored. The electromagnetic interference determining apparatus uses the second electromagnetic interference information and the second standard electromagnetic interference information to perform second secondary interference determining in the secondary interference determining unit. If a second secondary interference determining result is that the second electromagnetic interference information matches the second standard electromagnetic interference information, the second secondary interference determining result is used as the actual interference determining result of the second electromagnetic interference information, and the first primary interference determining result is discarded; or if the second secondary interference determining result is that the second electromagnetic interference information does not match the second standard electromagnetic interference information, the first primary interference determining result is used as the actual interference determining result of the second electromagnetic interference information, and the second secondary interference determining result is discarded.

The electromagnetic interference determining apparatus uses the third electromagnetic interference information and the third standard electromagnetic interference information to perform first primary interference determining in the primary interference determining unit. If a first primary interference determining result is that the third electromagnetic interference information matches the third standard electromagnetic interference information, the first primary interference determining result is used as an actual interference determining result of the third electromagnetic interference information; or if the first primary interference determining result is that the third electromagnetic interference information does not match the third standard electromagnetic interference information, the first primary interference determining result is temporarily stored. The electromagnetic interference determining apparatus uses the third electromagnetic interference information and the third standard electromagnetic interference information to perform second secondary interference determining in the secondary interference determining unit. If a second secondary interference determining result is that the third electromagnetic interference information matches the third standard electromagnetic interference information, the second secondary interference determining result is used as the actual interference determining result of the third electromagnetic interference information, and the first primary interference determining result is discarded; or if the second secondary interference determining result is that the third electromagnetic interference information does not match the third standard electromagnetic interference information, the first primary interference determining result is used as the actual interference determining result of the third electromagnetic interference information, and the second secondary interference determining result is discarded.

The system may further include a navigation station data detection apparatus, a standard station data storage apparatus, and a central control apparatus. The central control apparatus is connected to the navigation station data detection apparatus, the standard station data storage apparatus, and the electromagnetic interference determining apparatus.

When the first electromagnetic interference information, the second electromagnetic interference information, and the third electromagnetic interference information match the first standard electromagnetic interference information, the second standard electromagnetic interference information, and the third standard electromagnetic interference information respectively, the central control apparatus controls actions of the navigation station data detection apparatus and the standard station data storage apparatus.

The navigation station data detection apparatus may include a navigation device data detection apparatus, a communications device data detection apparatus, a meteorological device data detection apparatus, an alternating current data detection apparatus, a battery data detection apparatus, an air conditioning device data detection apparatus, a fire protection device data detection apparatus, a monitoring device data detection apparatus, and an anti-theft system data detection apparatus.

The navigation device data detection apparatus is configured to detect real-time navigation device data of the navigation station and send the real-time navigation device data to the central control apparatus.

The communications device data detection apparatus is configured to detect real-time communications device data of the navigation station and send the real-time communications device data to the central control apparatus.

The meteorological device data detection apparatus is configured to detect real-time meteorological device data of the navigation station and send the real-time meteorological device data to the central control apparatus.

The alternating current data detection apparatus is configured to detect real-time alternating current data of the navigation station and send the real-time alternating current data to the central control apparatus.

The battery data detection apparatus is configured to detect real-time battery data of the navigation station and send the real-time battery data to the central control apparatus.

The air conditioning device data detection apparatus is configured to detect real-time air conditioning device data of the navigation station and send the real-time air conditioning device data to the central control apparatus.

The fire protection device data detection apparatus is configured to detect real-time fire protection device data of the navigation station and send the real-time fire protection device data to the central control apparatus.

The monitoring device data detection apparatus is configured to detect real-time monitoring device data of the navigation station and send the real-time monitoring device data to the central control apparatus.

The anti-theft system data detection apparatus is configured to detect real-time anti-theft system data of the navigation station and send the real-time anti-theft system data to the central control apparatus.

The standard station data storage apparatus is configured to store standard navigation device data, standard communications device data, standard meteorological device data, standard alternating current data, standard battery data, standard air conditioning device data, standard fire protection device data, standard monitoring device data, and standard anti-theft system data during normal operation of the navigation station for the central control apparatus to call.

The central control apparatus uses the real-time navigation device data and the standard navigation device data to perform navigation device data determining. If a navigation device data determining result is that the real-time navigation device data matches the standard navigation device data, the central control apparatus continuously starts a navigation device; or if the navigation device data determining result is that the real-time navigation device data does not match the standard navigation device data, the central control apparatus turns off the navigation device.

The central control apparatus uses the real-time communications device data and the standard communications device data to perform communications device data determining. If a communications device data determining result is that the real-time communications device data matches the standard communications device data, the central control apparatus continuously starts a communications device; or if the communications device data determining result is that the real-time communications device data does not match the standard communications device data, the central control apparatus turns off the communications device.

The central control apparatus uses the real-time meteorological device data and the standard meteorological device data to perform meteorological device data determining. If a meteorological device data determining result is that the real-time meteorological device data matches the standard meteorological device data, the central control apparatus continuously starts a meteorological device; or if the meteorological device data determining result is that the real-time meteorological device data does not match the standard meteorological device data, the central control apparatus turns off the meteorological device.

The central control apparatus uses the real-time alternating current data and the standard alternating current data to perform alternating current data determining. If an alternating current data determining result is that the real-time alternating current data matches the standard alternating current data, the central control apparatus continuously enables an alternating current; or if the alternating current data determining result is that the real-time alternating current data does not match the standard alternating current data, the central control apparatus disables the alternating current.

The central control apparatus uses the real-time battery data and the standard battery data to perform battery data determining. If a battery data determining result is that the real-time battery data matches the standard battery data, the central control apparatus continuously enables a battery; or if the battery data determining result is that the real-time battery data does not match the standard battery data, the central control apparatus disables the battery.

The central control apparatus uses the real-time air conditioning device data and the standard air conditioning device data to perform air conditioning device data determining. If an air conditioning device data determining result is that the real-time air conditioning device data matches the standard air conditioning device data, the central control apparatus continuously starts an air conditioning device; or if the air conditioning device data determining result is that the real-time air conditioning device data does not match the standard air conditioning device data, the central control apparatus turns off the air conditioning device.

The central control apparatus uses the real-time fire protection device data and the standard fire protection device data to perform fire protection device data determining. If a fire protection device data determining result is that the real-time fire protection device data matches the standard fire protection device data, the central control apparatus continuously starts a fire protection device; or if the fire protection device data determining result is that the real-time fire protection device data does not match the standard fire protection device data, the central control apparatus turns off the fire protection device.

The central control apparatus uses the real-time monitoring device data and the standard monitoring device data to perform monitoring device data determining. If a monitoring device data determining result is that the real-time monitoring device data matches the standard monitoring device data, the central control apparatus continuously starts a monitoring device; or if the monitoring device data determining result is that the real-time monitoring device data does not match the standard monitoring device data, the central control apparatus turns off the monitoring device.

The central control apparatus uses the real-time anti-theft system data and the standard anti-theft system data to perform anti-theft system data determining. If an anti-theft system data determining result is that the real-time anti-theft system data matches the standard anti-theft system data, the central control apparatus continuously starts an anti-theft system; or if the anti-theft system data determining result is that the real-time anti-theft system data does not match the standard anti-theft system data, the central control apparatus turns off the anti-theft system.

Further, the electromagnetic environment evaluation system for a civil airport and an aviation station further includes a navigation device anomaly alarm apparatus, where the central control apparatus uses the real-time navigation device data and the standard navigation device data to perform the navigation device data determining, wherein the central control apparatus uses the real-time navigation device data and the standard navigation device data to perform, in a primary determining unit, first navigation device data determining, and if a first navigation device data determining result is that the real-time navigation device data matches the standard navigation device data, the first navigation device data determining result is used as an actual navigation device data determining result; or if the first navigation device data determining result is that the real-time navigation device data does not match the standard navigation device data, the first navigation device data determining result is temporarily stored; or the central control apparatus uses the real-time navigation device data and the standard navigation device data to perform, in a secondary determining unit, secondary navigation device data determining, and if a secondary navigation device data determining result is that the real-time navigation device data matches the standard navigation device data, the secondary navigation device data determining result is used as an actual navigation device data determining result, and the first navigation device data determining result is discarded; or if the secondary navigation device data determining result is that the real-time navigation device data does not match the standard navigation device data, the first navigation device data determining result is used as an actual navigation device data determining result, the secondary navigation device data determining result is discarded, and at the same time, the central control apparatus starts the navigation device anomaly alarm apparatus to alarm an anomaly of a navigation device.

Further, the electromagnetic environment evaluation system for a civil airport and an aviation station further includes a communication device anomaly alarm apparatus, where the central control apparatus uses real-time communication device data and standard communication device data to perform communication device data determining, wherein the central control apparatus uses the real-time communication device data and the standard communication device data to perform, in a primary determining unit, first communication device data determining, and if a first communication device data determining result is that the real-time communication device data matches the standard communication device data, the first communication device data determining result is used as an actual communication device data determining result; or if the first communication device data determining result is that the real-time communication device data does not match the standard communication device data, the first communication device data determining result is temporarily stored; or the central control apparatus uses the real-time communication device data and the standard communication device data to perform, in a secondary determining unit, secondary communication device data determining, and if a secondary communication device data determining result is that the real-time communication device data matches the standard communication device data, the secondary communication device data determining result is used as an actual communication device data determining result, and the first communication device data determining result is discarded; or if the secondary communication device data determining result is that the real-time communication device data does not match the standard communication device data, the first communication device data determining result is used as an actual communication device data determining result, the secondary communication device data determining result is discarded, and at the same time, the central control apparatus starts the communication device anomaly alarm apparatus to alarm an anomaly of a communication device.

Further, the electromagnetic environment evaluation system for a civil airport and an aviation station further includes a meteorological device anomaly alarm apparatus, where the central control apparatus uses real-time meteorological device data and standard meteorological device data to perform meteorological device data determining, wherein the central control apparatus uses the real-time meteorological device data and the standard meteorological device data to perform, in a primary determining unit, first meteorological device data determining, and if a first meteorological device data determining result is that the real-time meteorological device data matches the standard meteorological device data, the first meteorological device data determining result is used as an actual meteorological device data determining result; or if the first meteorological device data determining result is that the real-time meteorological device data does not match the standard meteorological device data, the first meteorological device data determining result is temporarily stored; or the central control apparatus uses the real-time meteorological device data and the standard meteorological device data to perform, in a secondary determining unit, secondary meteorological device data determining, and if a secondary meteorological device data determining result is that the real-time meteorological device data matches the standard meteorological device data, the secondary meteorological device data determining result is used as an actual meteorological device data determining result, and the first meteorological device data determining result is discarded; or if the secondary meteorological device data determining result is that the real-time meteorological device data does not match the standard meteorological device data, the first meteorological device data determining result is used as an actual meteorological device data determining result, the secondary meteorological device data determining result is discarded, and at the same time, the central control apparatus starts the meteorological device anomaly alarm apparatus to alarm an anomaly of a meteorological device.

Further, the electromagnetic environment evaluation system for a civil airport and an aviation station further includes an alternating current anomaly alarm apparatus, where the central control apparatus uses real-time alternating current data and standard alternating current data to perform alternating current data determining, wherein the central control apparatus uses the real-time alternating current data and the standard alternating current data to perform, in a primary determining unit, first alternating current data determining, and if a first alternating current data determining result is that the real-time alternating current data matches the standard alternating current data, the first alternating current data determining result is used as an actual alternating current data determining result; or if the first alternating current data determining result is that the real-time alternating current data does not match the standard alternating current data, the first alternating current data determining result is temporarily stored; or the central control apparatus uses the real-time alternating current data and the standard alternating current data to perform, in a secondary determining unit, secondary alternating current data determining, and if a secondary alternating current data determining result is that the real-time alternating current data matches the standard alternating current data, the secondary alternating current data determining result is used as an actual alternating current data determining result, and the first alternating current data determining result is discarded; or if the secondary alternating current data determining result is that the real-time alternating current data does not match the standard alternating current data, the first alternating current data determining result is used as an actual alternating current data determining result, the secondary alternating current data determining result is discarded, and at the same time, the central control apparatus starts the alternating current anomaly alarm apparatus to alarm an alternating current anomaly.

Further, the electromagnetic environment evaluation system for a civil airport and an aviation station further includes a storage battery anomaly alarm apparatus, where the central control apparatus uses real-time storage battery data and standard storage battery data to perform storage battery data determining, wherein the central control apparatus uses the real-time storage battery data and the standard storage battery data to perform, in a primary determining unit, first storage battery determining, and if a first storage battery data determining result is that the real-time storage battery data matches the standard storage battery data, the first storage battery data determining result is used as an actual storage battery data determining result; or if the first storage battery data determining result is that the real-time storage battery data does not match the standard storage battery data, the first storage battery data determining result is temporarily stored; or the central control apparatus uses the real-time storage battery data and the standard storage battery data to perform, in a secondary determining unit, secondary storage battery data determining, and if a secondary storage battery data determining result is that the real-time storage battery data matches the standard storage battery data, the secondary storage battery data determining result is used as an actual storage battery data determining result, and the first storage battery data determining result is discarded; or if the secondary storage battery data determining result is that the real-time storage battery data does not match the standard storage battery data, the first storage battery data determining result is used as an actual storage battery data determining result, the secondary storage battery data determining result is discarded, and at the same time, the central control apparatus starts the storage battery anomaly alarm apparatus to alarm an anomaly of a storage battery.

Further, the electromagnetic environment evaluation system for a civil airport and an aviation station further includes an anomaly alarm apparatus of air conditioning equipment, where the central control apparatus uses real-time air conditioning equipment data and standard air conditioning equipment data to perform air conditioning equipment data determining, wherein the central control apparatus uses the real-time air conditioning equipment data and the standard air conditioning equipment data to perform, in a primary determining unit, first air conditioning equipment data determining, and if a first air conditioning equipment data determining result is that the real-time air conditioning equipment data matches the standard air conditioning equipment data, the first air conditioning equipment data determining result is used as an actual air conditioning equipment data determining result; or if the first air conditioning equipment data determining result is that the real-time air conditioning equipment data does not match the standard air conditioning equipment data, the first air conditioning equipment data determining result is temporarily stored; or the central control apparatus uses the real-time air conditioning equipment data and the standard air conditioning equipment data to perform, in a secondary determining unit, secondary air conditioning equipment data determining, and if a secondary air conditioning equipment data determining result is that the real-time air conditioning equipment data matches the standard air conditioning equipment data, the secondary air conditioning equipment data determining result is used as an actual air conditioning equipment data determining result, and the first air conditioning equipment data determining result is discarded; or if the secondary air conditioning equipment data determining result is that the real-time air conditioning equipment data does not match the standard air conditioning equipment data, the first air conditioning equipment data determining result is used as an actual air conditioning equipment data determining result, the secondary air conditioning equipment data determining result is discarded, and at the same time, the central control apparatus starts the anomaly alarm apparatus of air conditioning equipment to alarm an anomaly of the air conditioning equipment.

Further, the electromagnetic environment evaluation system for a civil airport and an aviation station further includes an anomaly alarm apparatus of fire protection equipment, where the central control apparatus uses real-time fire protection equipment data and standard fire protection equipment data to perform fire protection equipment data determining, wherein the central control apparatus uses the real-time fire protection equipment data and the standard fire protection equipment data to perform, in a primary determining unit, first fire protection equipment data determining, and if a first fire protection equipment data determining result is that the real-time fire protection equipment data matches the standard fire protection equipment data, the first fire protection equipment data determining result is used as an actual fire protection equipment data determining result; or if the first fire protection equipment data determining result is that the real-time fire protection equipment data does not match the standard fire protection equipment data, the first fire protection equipment data determining result is temporarily stored; or the central control apparatus uses the real-time fire protection equipment data and the standard fire protection equipment data to perform, in a secondary determining unit, secondary fire protection equipment data determining, and if a secondary fire protection equipment data determining result is that the real-time fire protection equipment data matches the standard fire protection equipment data, the secondary fire protection equipment data determining result is used as an actual fire protection equipment data determining result, and the first fire protection equipment data determining result is discarded; or if the secondary fire protection equipment data determining result is that the real-time fire protection equipment data does not match the standard fire protection equipment data, the first fire protection equipment data determining result is used as an actual fire protection equipment data determining result, the secondary fire protection equipment data determining result is discarded, and at the same time, the central control apparatus starts the anomaly alarm apparatus of fire protection equipment to alarm an anomaly of the fire protection equipment.

Further, the electromagnetic environment evaluation system for a civil airport and an aviation station further includes an anomaly alarm apparatus of a monitoring device, where the central control apparatus uses real-time monitoring device data and standard monitoring device data to perform monitoring device data determining, wherein the central control apparatus uses the real-time monitoring device data and the standard monitoring device data to perform, in a primary determining unit, first monitoring device data determining, and if a first monitoring device data determining result is that the real-time monitoring device data matches the standard monitoring device data, the first monitoring device data determining result is used as an actual monitoring device data determining result; or if the first monitoring device data determining result is that the real-time monitoring device data does not match the standard monitoring device data, the first monitoring device data determining result is temporarily stored; or the central control apparatus uses the real-time monitoring device data and the standard monitoring device data to perform, in a secondary determining unit, secondary monitoring device data determining, and if a secondary monitoring device data determining result is that the real-time monitoring device data matches the standard monitoring device data, the secondary monitoring device data determining result is used as an actual monitoring device data determining result, and the first monitoring device data determining result is discarded; or if the secondary monitoring device data determining result is that the real-time monitoring device data does not match the standard monitoring device data, the first monitoring device data determining result is used as an actual monitoring device data determining result, the secondary monitoring device data determining result is discarded, and at the same time, the central control apparatus starts the anomaly alarm apparatus of a monitoring device to alarm an anomaly of the monitoring device.

Further, the electromagnetic environment evaluation system for a civil airport and an aviation station further includes an anti-theft system anomaly alarm apparatus, where the central control apparatus uses real-time anti-theft system data and standard anti-theft system data to perform anti-theft system data determining, wherein the central control apparatus uses the real-time anti-theft system data and the standard anti-theft system data to perform, in a primary determining unit, first anti-theft system data determining, and if a first anti-theft system data determining result is that the real-time anti-theft system data matches the standard anti-theft system data, the first anti-theft system data determining result is used as an actual anti-theft system data determining result; or if the first anti-theft system data determining result is that the real-time anti-theft system data does not match the standard anti-theft system data, the first anti-theft system data determining result is temporarily stored; or the central control apparatus uses the real-time anti-theft system data and the standard anti-theft system data to perform, in a secondary determining unit, secondary anti-theft system data determining, and if a secondary anti-theft system data determining result is that the real-time anti-theft system data matches the standard anti-theft system data, the secondary anti-theft system data determining result is used as an actual anti-theft system data determining result, and the first anti-theft system data determining result is discarded; or if the secondary anti-theft system data determining result is that the real-time anti-theft system data does not match the standard anti-theft system data, the first anti-theft system data determining result is used as an actual anti-theft system data determining result, the secondary anti-theft system data determining result is discarded, and at the same time, the central control apparatus starts the anti-theft system anomaly alarm apparatus to alarm an anomaly of the anti-theft system.

BENEFICIAL EFFECTS OF THE PRESENT DISCLOSURE

Beneficial Effect

Compared with the prior art, the present disclosure has the following beneficial effects:

The integrated transport hub, air-rail intermodality, and rail transit cause relatively strong electromagnetic interference to the navigation station. The high voltage transmission line and communications base station also cause relatively strong electromagnetic interference to the navigation station. The large charging pile and other ISM devices next to the airport cause electromagnetic interference to the navigation device in the airport. In this solution, such electromagnetic interference is detected. If the interference determining apparatus determines that there is an anomaly after performing first interference determining, the interference determining apparatus performs second interference determining to avoid that subsequent actions are incorrect due to accidental data errors of the interference determining apparatus, and further reduce an error rate. In addition, provided that the navigation station can normally work, health statuses of the apparatuses in the navigation station that are in a healthy or low-impact electromagnetic environment for a long time are monitored in real time. If the real-time data does not match the standard data, the central control apparatus responds in time to avoid serious accidents.

BRIEF DESCRIPTION OF THE DRAWINGS

Description of the Drawings

Figure 1:
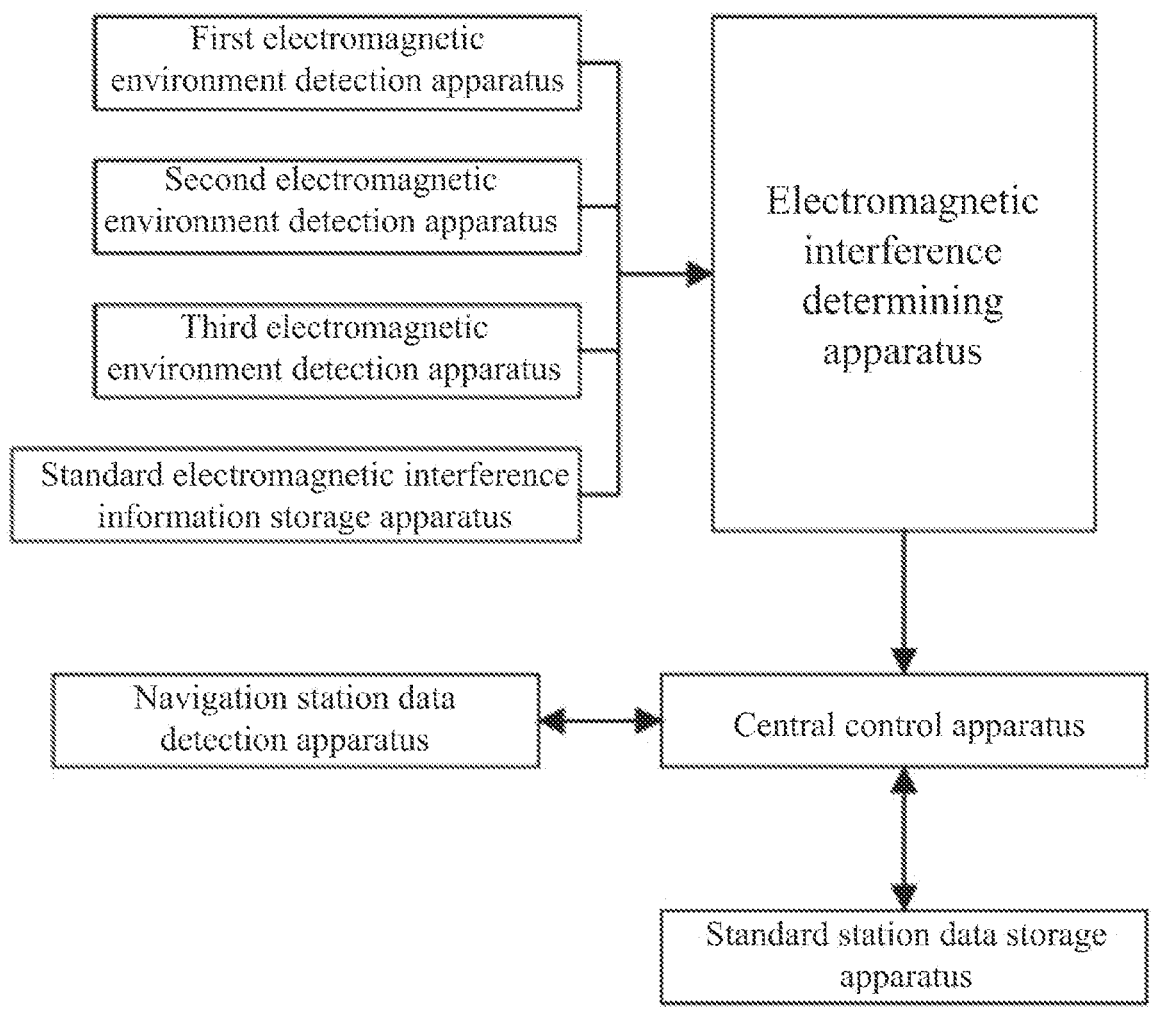
Figure 2:
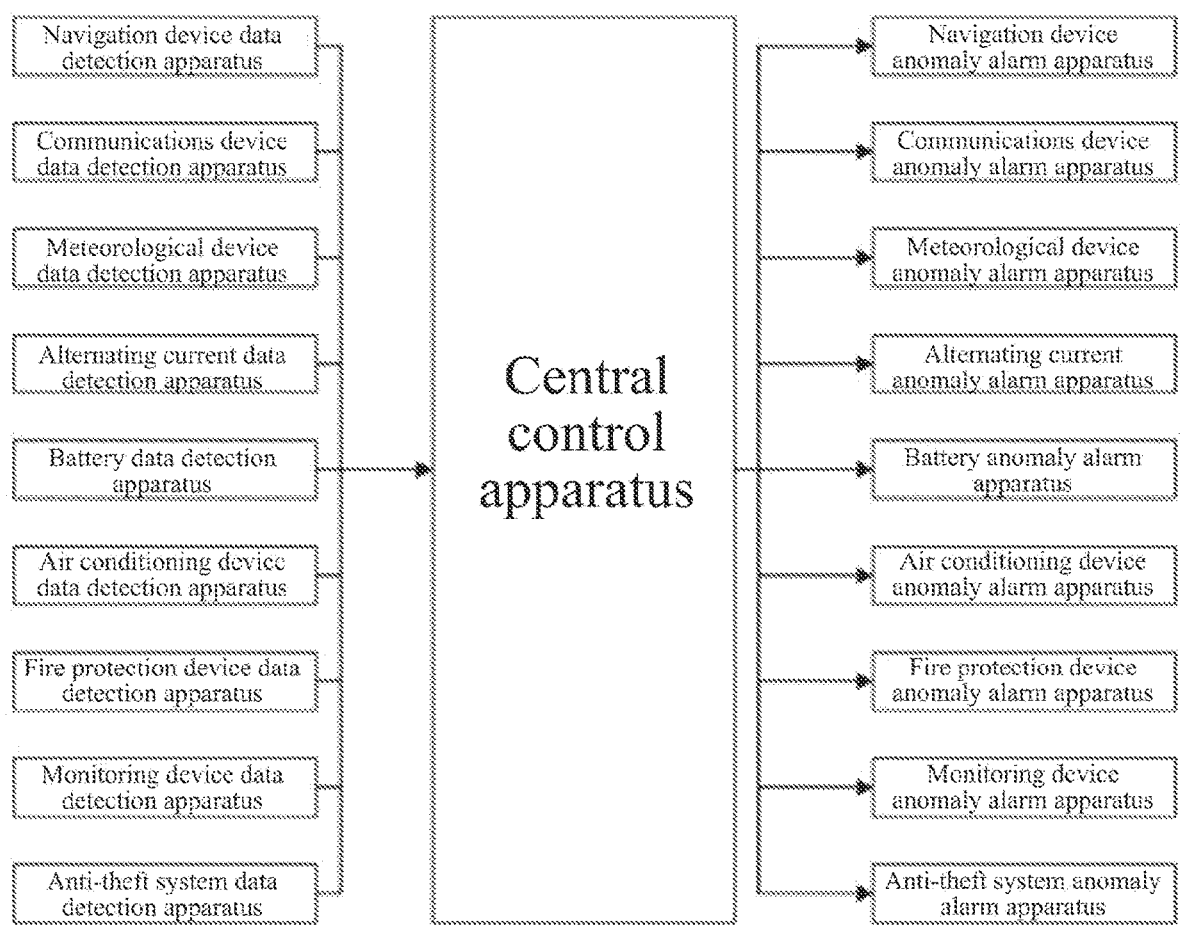

FIG. 1 is a schematic structural diagram of an embodiment of the present disclosure; and FIG. 2 is a schematic diagram of a partial structure of an embodiment of the present disclosure.

DETAILED DESCRIPTION OF THE EMBODIMENTS

Implementations of the Present Disclosure

The technical solutions of the embodiments of the present disclosure will be clearly and completely described below with reference to FIG. 1 and FIG. 2 of the present disclosure. Apparently, the described embodiments are merely a part rather than all of the embodiments of the present disclosure. All other embodiments obtained by a person of ordinary skill in the art based on the embodiments of the present disclosure without creative efforts shall fall within the protection scope of the present disclosure.

Embodiment

In the prior art, electromagnetic environments around a navigation station are mainly as follows: An integrated transport hub, air-rail intermodality, and rail transit cause relatively strong electromagnetic interference to the navigation station. A high voltage transmission line and a communications base station also cause relatively strong electromagnetic interference to the navigation station. A large charging pile and other ISM devices next to an airport cause electromagnetic interference to a navigation device in the airport. Whether these electromagnetic environments have impact on the navigation station must be determined at a current stage. A health status of the navigation station that is in an assessed low-impact electromagnetic environment for a long time also needs to be monitored in real time.

Therefore, an electromagnetic environment evaluation system for a civil airport and an aviation station is provided, as shown in FIG. 1 and FIG. 2. The system includes a first electromagnetic environment detection apparatus, a second electromagnetic environment detection apparatus, and a third electromagnetic environment detection apparatus.

The first electromagnetic environment detection apparatus is configured to detect first electromagnetic interference information caused to the navigation station by an integrated transport hub, air-rail intermodality, and rail transit.

The second electromagnetic environment detection apparatus is configured to detect second electromagnetic interference information caused to the navigation station by a high voltage transmission line and a communications base station.

The third electromagnetic environment detection apparatus is configured to detect third electromagnetic interference information caused to the navigation station by a large charging pile and an ISM device.

The system may further include a standard electromagnetic interference information storage apparatus and an electromagnetic interference determining apparatus.

The standard electromagnetic interference information storage apparatus is configured to store first standard electromagnetic interference information, second standard electromagnetic interference information, and third standard electromagnetic interference information.

The first standard electromagnetic interference information is electromagnetic interference information caused by the integrated transport hub, air-rail intermodality, and rail transit to the navigation station such that the navigation station can normally work.

The second standard electromagnetic interference information is electromagnetic interference information caused by the high voltage transmission line and communications base station to the navigation station such that the navigation station can normally work.

The third standard electromagnetic interference information is electromagnetic interference information caused by the large charging pile and ISM device to the navigation station such that the navigation station can normally work.

The first electromagnetic environment detection apparatus, the second electromagnetic environment detection apparatus, the third electromagnetic environment detection apparatus, and the standard electromagnetic interference information storage apparatus are connected to the electromagnetic interference determining apparatus.

The electromagnetic interference determining apparatus uses the first electromagnetic interference information and the first standard electromagnetic interference information to perform first primary interference determining in a primary interference determining unit. If a first primary interference determining result is that the first electromagnetic interference information matches the first standard electromagnetic interference information, the first primary interference determining result is used as an actual interference determining result of the first electromagnetic interference information; or if the first primary interference determining result is that the first electromagnetic interference information does not match the first standard electromagnetic interference information, the first primary interference determining result is temporarily stored. The electromagnetic interference determining apparatus uses the first electromagnetic interference information and the first standard electromagnetic interference information to perform second secondary interference determining in a secondary interference determining unit. If a second secondary interference determining result is that the first electromagnetic interference information matches the first standard electromagnetic interference information, the second secondary interference determining result is used as the actual interference determining result of the first electromagnetic interference information, and the first primary interference determining result is discarded; or if the second secondary interference determining result is that the first electromagnetic interference information does not match the first standard electromagnetic interference information, the first primary interference determining result is used as the actual interference determining result of the first electromagnetic interference information, and the second secondary interference determining result is discarded.

The electromagnetic interference determining apparatus uses the second electromagnetic interference information and the second standard electromagnetic interference information to perform first primary interference determining in the primary interference determining unit. If a first primary interference determining result is that the second electromagnetic interference information matches the second standard electromagnetic interference information, the first primary interference determining result is used as an actual interference determining result of the second electromagnetic interference information; or if the first primary interference determining result is that the second electromagnetic interference information does not match the second standard electromagnetic interference information, the first primary interference determining result is temporarily stored. The electromagnetic interference determining apparatus uses the second electromagnetic interference information and the second standard electromagnetic interference information to perform second secondary interference determining in the secondary interference determining unit. If a second secondary interference determining result is that the second electromagnetic interference information matches the second standard electromagnetic interference information, the second secondary interference determining result is used as the actual interference determining result of the second electromagnetic interference information, and the first primary interference determining result is discarded; or if the second secondary interference determining result is that the second electromagnetic interference information does not match the second standard electromagnetic interference information, the first primary interference determining result is used as the actual interference determining result of the second electromagnetic interference information, and the second secondary interference determining result is discarded.

The electromagnetic interference determining apparatus uses the third electromagnetic interference information and the third standard electromagnetic interference information to perform first primary interference determining in the primary interference determining unit. If a first primary interference determining result is that the third electromagnetic interference information matches the third standard electromagnetic interference information, the first primary interference determining result is used as an actual interference determining result of the third electromagnetic interference information; or if the first primary interference determining result is that the third electromagnetic interference information does not match the third standard electromagnetic interference information, the first primary interference determining result is temporarily stored. The electromagnetic interference determining apparatus uses the third electromagnetic interference information and the third standard electromagnetic interference information to perform second secondary interference determining in the secondary interference determining unit. If a second secondary interference determining result is that the third electromagnetic interference information matches the third standard electromagnetic interference information, the second secondary interference determining result is used as the actual interference determining result of the third electromagnetic interference information, and the first primary interference determining result is discarded; or if the second secondary interference determining result is that the third electromagnetic interference information does not match the third standard electromagnetic interference information, the first primary interference determining result is used as the actual interference determining result of the third electromagnetic interference information, and the second secondary interference determining result is discarded.

The system may further include a navigation station data detection apparatus, a standard station data storage apparatus, and a central control apparatus. The central control apparatus is connected to the navigation station data detection apparatus, the standard station data storage apparatus, and the electromagnetic interference determining apparatus.

When the first electromagnetic interference information, the second electromagnetic interference information, and the third electromagnetic interference information match the first standard electromagnetic interference information, the second standard electromagnetic interference information, and the third standard electromagnetic interference information respectively, the central control apparatus controls actions of the navigation station data detection apparatus and the standard station data storage apparatus.

The navigation station data detection apparatus may include a navigation device data detection apparatus, a communications device data detection apparatus, a meteorological device data detection apparatus, an alternating current data detection apparatus, a battery data detection apparatus, an air conditioning device data detection apparatus, a fire protection device data detection apparatus, a monitoring device data detection apparatus, and an anti-theft system data detection apparatus.

The navigation device data detection apparatus is configured to detect real-time navigation device data of the navigation station and send the real-time navigation device data to the central control apparatus.

The communications device data detection apparatus is configured to detect real-time communications device data of the navigation station and send the real-time communications device data to the central control apparatus.

The meteorological device data detection apparatus is configured to detect real-time meteorological device data of the navigation station and send the real-time meteorological device data to the central control apparatus.

The alternating current data detection apparatus is configured to detect real-time alternating current data of the navigation station and send the real-time alternating current data to the central control apparatus.

The battery data detection apparatus is configured to detect real-time battery data of the navigation station and send the real-time battery data to the central control apparatus.

The air conditioning device data detection apparatus is configured to detect real-time air conditioning device data of the navigation station and send the real-time air conditioning device data to the central control apparatus.

The fire protection device data detection apparatus is configured to detect real-time fire protection device data of the navigation station and send the real-time fire protection device data to the central control apparatus.

The monitoring device data detection apparatus is configured to detect real-time monitoring device data of the navigation station and send the real-time monitoring device data to the central control apparatus.

The anti-theft system data detection apparatus is configured to detect real-time anti-theft system data of the navigation station and send the real-time anti-theft system data to the central control apparatus.

The standard station data storage apparatus is configured to store standard navigation device data, standard communications device data, standard meteorological device data, standard alternating current data, standard battery data, standard air conditioning device data, standard fire protection device data, standard monitoring device data, and standard anti-theft system data during normal operation of the navigation station for the central control apparatus to call.

The central control apparatus uses the real-time navigation device data and the standard navigation device data to perform navigation device data determining. If a navigation device data determining result is that the real-time navigation device data matches the standard navigation device data, the central control apparatus continuously starts a navigation device; or if the navigation device data determining result is that the real-time navigation device data does not match the standard navigation device data, the central control apparatus turns off the navigation device.

The central control apparatus uses the real-time communications device data and the standard communications device data to perform communications device data determining. If a communications device data determining result is that the real-time communications device data matches the standard communications device data, the central control apparatus continuously starts a communications device; or if the communications device data determining result is that the real-time communications device data does not match the standard communications device data, the central control apparatus turns off the communications device.

The central control apparatus uses the real-time meteorological device data and the standard meteorological device data to perform meteorological device data determining. If a meteorological device data determining result is that the real-time meteorological device data matches the standard meteorological device data, the central control apparatus continuously starts a meteorological device; or if the meteorological device data determining result is that the real-time meteorological device data does not match the standard meteorological device data, the central control apparatus turns off the meteorological device.

The central control apparatus uses the real-time alternating current data and the standard alternating current data to perform alternating current data determining. If an alternating current data determining result is that the real-time alternating current data matches the standard alternating current data, the central control apparatus continuously enables an alternating current; or if the alternating current data determining result is that the real-time alternating current data does not match the standard alternating current data, the central control apparatus disables the alternating current.

The central control apparatus uses the real-time battery data and the standard battery data to perform battery data determining. If a battery data determining result is that the real-time battery data matches the standard battery data, the central control apparatus continuously enables a battery; or if the battery data determining result is that the real-time battery data does not match the standard battery data, the central control apparatus disables the battery.

The central control apparatus uses the real-time air conditioning device data and the standard air conditioning device data to perform air conditioning device data determining. If an air conditioning device data determining result is that the real-time air conditioning device data matches the standard air conditioning device data, the central control apparatus continuously starts an air conditioning device; or if the air conditioning device data determining result is that the real-time air conditioning device data does not match the standard air conditioning device data, the central control apparatus turns off the air conditioning device.

The central control apparatus uses the real-time fire protection device data and the standard fire protection device data to perform fire protection device data determining. If a fire protection device data determining result is that the real-time fire protection device data matches the standard fire protection device data, the central control apparatus continuously starts a fire protection device; or if the fire protection device data determining result is that the real-time fire protection device data does not match the standard fire protection device data, the central control apparatus turns off the fire protection device.

The central control apparatus uses the real-time monitoring device data and the standard monitoring device data to perform monitoring device data determining. If a monitoring device data determining result is that the real-time monitoring device data matches the standard monitoring device data, the central control apparatus continuously starts a monitoring device; or if the monitoring device data determining result is that the real-time monitoring device data does not match the standard monitoring device data, the central control apparatus turns off the monitoring device.

The central control apparatus uses the real-time anti-theft system data and the standard anti-theft system data to perform anti-theft system data determining. If an anti-theft system data determining result is that the real-time anti-theft system data matches the standard anti-theft system data, the central control apparatus continuously starts an anti-theft system; or if the anti-theft system data determining result is that the real-time anti-theft system data does not match the standard anti-theft system data, the central control apparatus turns off the anti-theft system.

The integrated transport hub, air-rail intermodality, and rail transit cause relatively strong electromagnetic interference to the navigation station. The high voltage transmission line and communications base station also cause relatively strong electromagnetic interference to the navigation station. The large charging pile and other ISM devices next to the airport cause electromagnetic interference to the navigation device in the airport. In this solution, such electromagnetic interference is detected. If the interference determining apparatus determines that there is an anomaly after performing first interference determining, the interference determining apparatus performs second interference determining to avoid that subsequent actions are incorrect due to accidental data errors of the interference determining apparatus, and further reduce an error rate. In addition, provided that the navigation station can normally work, health statuses of the apparatuses in the navigation station that are in a healthy or low-impact electromagnetic environment for a long time are monitored in real time. If the real-time data does not match the standard data, the central control apparatus responds in time to avoid serious accidents.

Further, the electromagnetic environment evaluation system for a civil airport and an aviation station further includes a navigation device anomaly alarm apparatus, where the central control apparatus uses the real-time navigation device data and the standard navigation device data to perform the navigation device data determining, wherein the central control apparatus uses the real-time navigation device data and the standard navigation device data to perform, in a primary determining unit, first navigation device data determining, and if a first navigation device data determining result is that the real-time navigation device data matches the standard navigation device data, the first navigation device data determining result is used as an actual navigation device data determining result; or if the first navigation device data determining result is that the real-time navigation device data does not match the standard navigation device data, the first navigation device data determining result is temporarily stored; or the central control apparatus uses the real-time navigation device data and the standard navigation device data to perform, in a secondary determining unit, secondary navigation device data determining, and if a secondary navigation device data determining result is that the real-time navigation device data matches the standard navigation device data, the secondary navigation device data determining result is used as an actual navigation device data determining result, and the first navigation device data determining result is discarded; or if the secondary navigation device data determining result is that the real-time navigation device data does not match the standard navigation device data, the first navigation device data determining result is used as an actual navigation device data determining result, the secondary navigation device data determining result is discarded, and at the same time, the central control apparatus starts the navigation device anomaly alarm apparatus to alarm an anomaly of a navigation device.

Further, the electromagnetic environment evaluation system for a civil airport and an aviation station further includes a communication device anomaly alarm apparatus, where
the central control apparatus uses real-time communication device data and standard communication device data to perform communication device data determining, wherein the central control apparatus uses the real-time communication device data and the standard communication device data to perform, in a primary determining unit, first communication device data determining, and if a first communication device data determining result is that the real-time communication device data matches the standard communication device data, the first communication device data determining result is used as an actual communication device data determining result; or if the first communication device data determining result is that the real-time communication device data does not match the standard communication device data, the first communication device data determining result is temporarily stored; or the central control apparatus uses the real-time communication device data and the standard communication device data to perform, in a secondary determining unit, secondary communication device data determining, and if a secondary communication device data determining result is that the real-time communication device data matches the standard communication device data, the secondary communication device data determining result is used as an actual communication device data determining result, and the first communication device data determining result is discarded; or if the secondary communication device data determining result is that the real-time communication device data does not match the standard communication device data, the first communication device data determining result is used as an actual communication device data determining result, the secondary communication device data determining result is discarded, and at the same time, the central control apparatus starts the communication device anomaly alarm apparatus to alarm an anomaly of a communication device.

Further, the electromagnetic environment evaluation system for a civil airport and an aviation station further includes a meteorological device anomaly alarm apparatus, where
the central control apparatus uses real-time meteorological device data and standard meteorological device data to perform meteorological device data determining, wherein the central control apparatus uses the real-time meteorological device data and the standard meteorological device data to perform, in a primary determining unit, first meteorological device data determining, and if a first meteorological device data determining result is that the real-time meteorological device data matches the standard meteorological device data, the first meteorological device data determining result is used as an actual meteorological device data determining result; or if the first meteorological device data determining result is that the real-time meteorological device data does not match the standard meteorological device data, the first meteorological device data determining result is temporarily stored; or the central control apparatus uses the real-time meteorological device data and the standard meteorological device data to perform, in a secondary determining unit, secondary meteorological device data determining, and if a secondary meteorological device data determining result is that the real-time meteorological device data matches the standard meteorological device data, the secondary meteorological device data determining result is used as an actual meteorological device data determining result, and the first meteorological device data determining result is discarded; or if the secondary meteorological device data determining result is that the real-time meteorological device data does not match the standard meteorological device data, the first meteorological device data determining result is used as an actual meteorological device data determining result, the secondary meteorological device data determining result is discarded, and at the same time, the central control apparatus starts the meteorological device anomaly alarm apparatus to alarm an anomaly of a meteorological device.

Further, the electromagnetic environment evaluation system for a civil airport and an aviation station further includes an alternating current anomaly alarm apparatus, where
the central control apparatus uses real-time alternating current data and standard alternating current data to perform alternating current data determining, wherein the central control apparatus uses the real-time alternating current data and the standard alternating current data to perform, in a primary determining unit, first alternating current data determining, and if a first alternating current data determining result is that the real-time alternating current data matches the standard alternating current data, the first alternating current data determining result is used as an actual alternating current data determining result; or if the first alternating current data determining result is that the real-time alternating current data does not match the standard alternating current data, the first alternating current data determining result is temporarily stored; or the central control apparatus uses the real-time alternating current data and the standard alternating current data to perform, in a secondary determining unit, secondary alternating current data determining, and if a secondary alternating current data determining result is that the real-time alternating current data matches the standard alternating current data, the secondary alternating current data determining result is used as an actual alternating current data determining result, and the first alternating current data determining result is discarded; or if the secondary alternating current data determining result is that the real-time alternating current data does not match the standard alternating current data, the first alternating current data determining result is used as an actual alternating current data determining result, the secondary alternating current data determining result is discarded, and at the same time, the central control apparatus starts the alternating current anomaly alarm apparatus to alarm an alternating current anomaly.

Further, the electromagnetic environment evaluation system for a civil airport and an aviation station further includes a storage battery anomaly alarm apparatus, where
the central control apparatus uses real-time storage battery data and standard storage battery data to perform storage battery data determining, wherein the central control apparatus uses the real-time storage battery data and the standard storage battery data to perform, in a primary determining unit, first storage battery data determining, and if a first storage battery data determining result is that the real-time storage battery data matches the standard storage battery data, the first storage battery data determining result is used as an actual storage battery data determining result; or if the first storage battery data determining result is that the real-time storage battery data does not match the standard storage battery data, the first storage battery data determining result is temporarily stored; or the central control apparatus uses the real-time storage battery data and the standard storage battery data to perform, in a secondary determining unit, secondary storage battery data determining, and if a secondary storage battery data determining result is that the real-time storage battery data matches the standard storage battery data, the secondary storage battery data determining result is used as an actual storage battery data determining result, and the first storage battery data determining result is discarded; or if the secondary storage battery data determining result is that the real-time storage battery data does not match the standard storage battery data, the first storage battery data determining result is used as an actual storage battery data determining result, the secondary storage battery data determining result is discarded, and at the same time, the central control apparatus starts the storage battery anomaly alarm apparatus to alarm an anomaly of a storage battery.

Further, the electromagnetic environment evaluation system for a civil airport and an aviation station further includes an anomaly alarm apparatus of air conditioning equipment, where the central control apparatus uses real-time air conditioning equipment data and standard air conditioning equipment data to perform air conditioning equipment data determining, wherein the central control apparatus uses the real-time air conditioning equipment data and the standard air conditioning equipment data to perform, in a primary determining unit, first air conditioning equipment data determining, and if a first air conditioning equipment data determining result is that the real-time air conditioning equipment data matches the standard air conditioning equipment data, the first air conditioning equipment data determining result is used as an actual air conditioning equipment data determining result; or if the first air conditioning equipment data determining result is that the real-time air conditioning equipment data does not match the standard air conditioning equipment data, the first air conditioning equipment data determining result is temporarily stored; or the central control apparatus uses the real-time air conditioning equipment data and the standard air conditioning equipment data to perform, in a secondary determining unit, secondary air conditioning equipment data determining, and if a secondary air conditioning equipment data determining result is that the real-time air conditioning equipment data matches the standard air conditioning equipment data, the secondary air conditioning equipment data determining result is used as an actual air conditioning equipment data determining result, and the first air conditioning equipment data determining result is discarded; or if the secondary air conditioning equipment data determining result is that the real-time air conditioning equipment data does not match the standard air conditioning equipment data, the first air conditioning equipment data determining result is used as an actual air conditioning equipment data determining result, the secondary air conditioning equipment data determining result is discarded, and at the same time, the central control apparatus starts the anomaly alarm apparatus of air conditioning equipment to alarm an anomaly of the air conditioning equipment.

Further, the electromagnetic environment evaluation system for a civil airport and an aviation station further includes an anomaly alarm apparatus of fire protection equipment, where the central control apparatus uses real-time fire protection equipment data and standard fire protection equipment data to perform fire protection equipment data determining, wherein the central control apparatus uses the real-time fire protection equipment data and the standard fire protection equipment data to perform, in a primary determining unit, first fire protection equipment data determining, and if a first fire protection equipment data determining result is that the real-time fire protection equipment data matches the standard fire protection equipment data, the first fire protection equipment data determining result is used as an actual fire protection equipment data determining result; or if the first fire protection equipment data determining result is that the real-time fire protection equipment data does not match the standard fire protection equipment data, the first fire protection equipment data determining result is temporarily stored; or the central control apparatus uses the real-time fire protection equipment data and the standard fire protection equipment data to perform, in a secondary determining unit, secondary fire protection equipment data determining, and if a secondary fire protection equipment data determining result is that the real-time fire protection equipment data matches the standard fire protection equipment data, the secondary fire protection equipment data determining result is used as an actual fire protection equipment data determining result, and the first fire protection equipment data determining result is discarded; or if the secondary fire protection equipment data determining result is that the real-time fire protection equipment data does not match the standard fire protection equipment data, the first fire protection equipment data determining result is used as an actual fire protection equipment data determining result, the secondary fire protection equipment data determining result is discarded, and at the same time, the central control apparatus starts the anomaly alarm apparatus of fire protection equipment to alarm an anomaly of the fire protection equipment.

Further, the electromagnetic environment evaluation system for a civil airport and an aviation station further includes an anomaly alarm apparatus of a monitoring device, where the central control apparatus uses real-time monitoring device data and standard monitoring device data to perform monitoring device data determining, wherein the central control apparatus uses the real-time monitoring device data and the standard monitoring device data to perform, in a primary determining unit, first monitoring device data determining, and if a first monitoring device data determining result is that the real-time monitoring device data matches the standard monitoring device data, the first monitoring device data determining result is used as an actual monitoring device data determining result; or if the first monitoring device data determining result is that the real-time monitoring device data does not match the standard monitoring device data, the first monitoring device data determining result is temporarily stored; or the central control apparatus uses the real-time monitoring device data and the standard monitoring device data to perform, in a secondary determining unit, secondary monitoring device data determining, and if a secondary monitoring device data determining result is that the real-time monitoring device data matches the standard monitoring device data, the secondary monitoring device data determining result is used as an actual monitoring device data determining result, and the first monitoring device data determining result is discarded; or if the secondary monitoring device data determining result is that the real-time monitoring device data does not match the standard monitoring device data, the first monitoring device data determining result is used as an actual monitoring device data determining result, the secondary monitoring device data determining result is discarded, and at the same time, the central control apparatus starts the anomaly alarm apparatus of a monitoring device to alarm an anomaly of the monitoring device.

Further, the electromagnetic environment evaluation system for a civil airport and an aviation station further includes an anti-theft system anomaly alarm apparatus, where the central control apparatus uses real-time anti-theft system data and standard anti-theft system data to perform anti-theft system data determining, wherein the central control apparatus uses the real-time anti-theft system data and the standard anti-theft system data to perform, in a primary determining unit, first anti-theft system data determining, and if a first anti-theft system data determining result is that the real-time anti-theft system data matches the standard anti-theft system data, the first anti-theft system data determining result is used as an actual anti-theft system data determining result; or if the first anti-theft system data determining result is that the real-time anti-theft system data does not match the standard anti-theft system data, the first anti-theft system data determining result is temporarily stored; or the central control apparatus uses the real-time anti-theft system data and the standard anti-theft system data to perform, in a secondary determining unit, secondary anti-theft system data determining, and if a secondary anti-theft system data determining result is that the real-time anti-theft system data matches the standard anti-theft system data, the secondary anti-theft system data determining result is used as an actual anti-theft system data determining result, and the first anti-theft system data determining result is discarded; or if the secondary anti-theft system data determining result is that the real-time anti-theft system data does not match the standard anti-theft system data, the first anti-theft system data determining result is used as an actual anti-theft system data determining result, the secondary anti-theft system data determining result is discarded, and at the same time, the central control apparatus starts the anti-theft system anomaly alarm apparatus to alarm an anomaly of the anti-theft system.

For the determining of the above navigation station device detection data, when there is a mismatch in the determining results, secondary determining is conducted, and both the primary determining unit and the secondary determining unit are used, which are different units so as to avoid misjudgment caused by the failure of the primary determining unit, and prevent subsequent action accidents.

The above described are the preferred embodiments of the present disclosure. Any changes and functional effects made according to the technical solutions of the present disclosure without departing from the scope of the technical solutions of the present disclosure should all belong to the protection scope of the present disclosure.

What is claimed is:

1. An electromagnetic environment evaluation system for a civil airport and an aviation station, comprising a first electromagnetic environment detection apparatus, a second electromagnetic environment detection apparatus, and a third electromagnetic environment detection apparatus, wherein the first electromagnetic environment detection apparatus is configured to detect first electromagnetic interference information caused to a navigation station by an integrated transport hub, air-rail intermodality, and rail transit;

the second electromagnetic environment detection apparatus is configured to detect second electromagnetic interference information caused to the navigation station by a high voltage transmission line and a communications base station;

the third electromagnetic environment detection apparatus is configured to detect third electromagnetic interference information caused to the navigation station by a large charging pile and an industrial, scientific, and medical (ISM) device;

the system further comprises a standard electromagnetic interference information storage apparatus and an electromagnetic interference determining apparatus;

the standard electromagnetic interference information storage apparatus is configured to store first standard electromagnetic interference information, second standard electromagnetic interference information, and third standard electromagnetic interference information;

the first standard electromagnetic interference information is electromagnetic interference information caused by the integrated transport hub, air-rail intermodality, and rail transit to the navigation station such that the navigation station can normally work;

the second standard electromagnetic interference information is electromagnetic interference information caused by the high voltage transmission line and communications base station to the navigation station such that the navigation station can normally work;

the third standard electromagnetic interference information is electromagnetic interference information caused by the large charging pile and ISM device to the navigation station such that the navigation station can normally work;

the first electromagnetic environment detection apparatus, the second electromagnetic environment detection apparatus, the third electromagnetic environment detection apparatus, and the standard electromagnetic interference information storage apparatus are connected to the electromagnetic interference determining apparatus;

the electromagnetic interference determining apparatus uses the first electromagnetic interference information and the first standard electromagnetic interference information to perform first primary interference determining in a primary interference determining unit, and if a first primary interference determining result is that the first electromagnetic interference information matches the first standard electromagnetic interference information, the first primary interference determining result is used as an actual interference determining result of the first electromagnetic interference information; or if the first primary interference determining result is that the first electromagnetic interference information does not match the first standard electromagnetic interference information, the first primary interference determining result is temporarily stored; and the electromagnetic interference determining apparatus uses the first electromagnetic interference information and the first standard electromagnetic interference information to perform second secondary interference determining in a secondary interference determining unit, and if a second secondary interference determining result is that the first electromagnetic interference information matches the first standard electromagnetic interference information, the second secondary interference determining result is used as the actual interference determining result of the first electromagnetic interference information, and the first primary interference determining result is discarded; or if the second secondary interference determining result is that the first electromagnetic interference information does not match the first standard electromagnetic interference information, the first primary interference determining result is used as the actual interference determining result of the first electromagnetic interference information, and the second secondary interference determining result is discarded;

the electromagnetic interference determining apparatus uses the second electromagnetic interference information and the second standard electromagnetic interference information to perform first primary interference determining in the primary interference determining unit, and if a first primary interference determining result is that the second electromagnetic interference information matches the second standard electromagnetic interference information, the first primary interference determining result is used as an actual interference determining result of the second electromagnetic interference information; or if the first primary interference determining result is that the second electromagnetic interference information does not match the second standard electromagnetic interference information, the first primary interference determining result is temporarily stored; and the electromagnetic interference determining apparatus uses the second electromagnetic interference information and the second standard electromagnetic interference information to perform second secondary interference determining in the secondary interference determining unit, and if a second secondary interference determining result is that the second electromagnetic interference information matches the second standard electromagnetic interference information, the second secondary interference determining result is used as the actual interference determining result of the second electromagnetic interference information, and the first primary interference determining result is discarded; or if the second secondary interference determining result is that the second electromagnetic interference information does not match the second standard electromagnetic interference information, the first primary interference determining result is used as the actual interference determining result of the second electromagnetic interference information, and the second secondary interference determining result is discarded;

the electromagnetic interference determining apparatus uses the third electromagnetic interference information and the third standard electromagnetic interference information to perform first primary interference determining in the primary interference determining unit, and if a first primary interference determining result is that the third electromagnetic interference information matches the third standard electromagnetic interference information, the first primary interference determining result is used as an actual interference determining result of the third electromagnetic interference information; or if the first primary interference determining result is that the third electromagnetic interference information does not match the third standard electromagnetic interference information, the first primary interference determining result is temporarily stored; and the electromagnetic interference determining apparatus uses the third electromagnetic interference information and the third standard electromagnetic interference information to perform second secondary interference determining in the secondary interference determining unit, and if a second secondary interference determining result is that the third electromagnetic interference information matches the third standard electromagnetic interference information, the second secondary interference determining result is used as the actual interference determining result of the third electromagnetic interference information, and the first primary interference determining result is discarded; or if the second secondary interference determining result is that the third electromagnetic interference information does not match the third standard electromagnetic interference information, the first primary interference determining result is used as the actual interference determining result of the third electromagnetic interference information, and the second secondary interference determining result is discarded;

the system further comprises a navigation station data detection apparatus, a standard station data storage apparatus, and a central control apparatus, wherein the central control apparatus is connected to the navigation station data detection apparatus, the standard station data storage apparatus, and the electromagnetic interference determining apparatus;

when the first electromagnetic interference information, the second electromagnetic interference information, and the third electromagnetic interference information match the first standard electromagnetic interference information, the second standard electromagnetic interference information, and the third standard electromagnetic interference information respectively, the central control apparatus controls actions of the navigation station data detection apparatus and the standard station data storage apparatus;

the navigation station data detection apparatus comprises a navigation device data detection apparatus, a communications device data detection apparatus, a meteorological device data detection apparatus, an alternating current data detection apparatus, a battery data detection apparatus, an air conditioning device data detection apparatus, a fire protection device data detection apparatus, a monitoring device data detection apparatus, and an anti-theft system data detection apparatus;

the navigation device data detection apparatus is configured to detect real-time navigation device data of the navigation station and send the real-time navigation device data to the central control apparatus;

the communications device data detection apparatus is configured to detect real-time communications device data of the navigation station and send the real-time communications device data to the central control apparatus;

the meteorological device data detection apparatus is configured to detect real-time meteorological device data of the navigation station and send the real-time meteorological device data to the central control apparatus;

the alternating current data detection apparatus is configured to detect real-time alternating current data of the navigation station and send the real-time alternating current data to the central control apparatus;

the battery data detection apparatus is configured to detect real-time battery data of the navigation station and send the real-time battery data to the central control apparatus;

the air conditioning device data detection apparatus is configured to detect real-time air conditioning device data of the navigation station and send the real-time air conditioning device data to the central control apparatus;

the fire protection device data detection apparatus is configured to detect real-time fire protection device data of the navigation station and send the real-time fire protection device data to the central control apparatus;

the monitoring device data detection apparatus is configured to detect real-time monitoring device data of the navigation station and send the real-time monitoring device data to the central control apparatus;

the anti-theft system data detection apparatus is configured to detect real-time anti-theft system data of the navigation station and send the real-time anti-theft system data to the central control apparatus;

the standard station data storage apparatus is configured to store standard navigation device data, standard communications device data, standard meteorological device data, standard alternating current data, standard battery data, standard air conditioning device data, standard fire protection device data, standard monitoring device data, and standard anti-theft system data during normal operation of the navigation station for the central control apparatus to call;

the central control apparatus uses the real-time navigation device data and the standard navigation device data to perform navigation device data determining, and if a navigation device data determining result is that the real-time navigation device data matches the standard navigation device data, the central control apparatus continuously starts a navigation device; or if the navigation device data determining result is that the real-time navigation device data does not match the standard navigation device data, the central control apparatus turns off the navigation device;

the central control apparatus uses the real-time communications device data and the standard communications device data to perform communications device data determining, and if a communications device data determining result is that the real-time communications device data matches the standard communications device data, the central control apparatus continuously starts a communications device; or if the communications device data determining result is that the real-time communications device data does not match the standard communications device data, the central control apparatus turns off the communications device;

the central control apparatus uses the real-time meteorological device data and the standard meteorological device data to perform meteorological device data determining, and if a meteorological device data determining result is that the real-time meteorological device data matches the standard meteorological device data, the central control apparatus continuously starts a meteorological device; or if the meteorological device data determining result is that the real-time meteorological device data does not match the standard meteorological device data, the central control apparatus turns off the meteorological device;

the central control apparatus uses the real-time alternating current data and the standard alternating current data to perform alternating current data determining, and if an alternating current data determining result is that the real-time alternating current data matches the standard alternating current data, the central control apparatus continuously enables an alternating current; or if the alternating current data determining result is that the real-time alternating current data does not match the standard alternating current data, the central control apparatus disables the alternating current;

the central control apparatus uses the real-time battery data and the standard battery data to perform battery data determining, and if a battery data determining result is that the real-time battery data matches the standard battery data, the central control apparatus continuously enables a battery; or if the battery data determining result is that the real-time battery data does not match the standard battery data, the central control apparatus disables the battery;

the central control apparatus uses the real-time air conditioning device data and the standard air conditioning device data to perform air conditioning device data determining, and if an air conditioning device data determining result is that the real-time air conditioning device data matches the standard air conditioning device data, the central control apparatus continuously starts an air conditioning device; or if the air conditioning device data determining result is that the real-time air conditioning device data does not match the standard air conditioning device data, the central control apparatus turns off the air conditioning device;

the central control apparatus uses the real-time fire protection device data and the standard fire protection device data to perform fire protection device data determining, and if a fire protection device data determining result is that the real-time fire protection device data matches the standard fire protection device data, the central control apparatus continuously starts a fire protection device; or if the fire protection device data determining result is that the real-time fire protection device data does not match the standard fire protection device data, the central control apparatus turns off the fire protection device;

the central control apparatus uses the real-time monitoring device data and the standard monitoring device data to perform monitoring device data determining, and if a monitoring device data determining result is that the real-time monitoring device data matches the standard monitoring device data, the central control apparatus continuously starts a monitoring device; or if the monitoring device data determining result is that the real-time monitoring device data does not match the standard monitoring device data, the central control apparatus turns off the monitoring device; and the central control apparatus uses the real-time anti-theft system data and the standard anti-theft system data to perform anti-theft system data determining, and if an anti-theft system data determining result is that the real-time anti-theft system data matches the standard anti-theft system data, the central control apparatus continuously starts an anti-theft system; or if the anti-theft system data determining result is that the real-time anti-theft system data does not match the standard anti-theft system data, the central control apparatus turns off the anti-theft system.

2. The electromagnetic environment evaluation system for a civil airport and an aviation station according to claim 1, further comprising a navigation device anomaly alarm apparatus, wherein the central control apparatus uses the real-time navigation device data and the standard navigation device data to perform the navigation device data determining, wherein the central control apparatus uses the real-time navigation device data and the standard navigation device data to perform, in a primary determining unit, first navigation device data determining, and if a first navigation device data determining result is that the real-time navigation device data matches the standard navigation device data, the first navigation device data determining result is used as an actual navigation device data determining result; or if the first navigation device data determining result is that the real-time navigation device data does not match the standard navigation device data, the first navigation device data determining result is temporarily stored; or the central control apparatus uses the real-time navigation device data and the standard navigation device data to perform, in a secondary determining unit, secondary navigation device data determining, and if a secondary navigation device data determining result is that the real-time navigation device data matches the standard navigation device data, the secondary navigation device data determining result is used as an actual navigation device data determining result, and the first navigation device data determining result is discarded; or if the secondary navigation device data determining result is that the real-time navigation device data does not match the standard navigation device data, the first navigation device data determining result is used as an actual navigation device data determining result, the secondary navigation device data determining result is discarded, and at the same time, the central control apparatus starts the navigation device anomaly alarm apparatus to alarm an anomaly of a navigation device.

3. The electromagnetic environment evaluation system for a civil airport and an aviation station according to claim 1, further comprising a communication device anomaly alarm apparatus, wherein the central control apparatus uses real-time communication device data and standard communication device data to perform communication device data determining, wherein the central control apparatus uses the real-time communication device data and the standard communication device data to perform, in a primary determining unit, first communication device data determining, and if a first communication device data determining result is that the real-time communication device data matches the standard communication device data, the first communication device data determining result is used as an actual communication device data determining result; or if the first communication device data determining result is that the real-time communication device data does not match the standard communication device data, the first communication device data determining result is temporarily stored; or the central control apparatus uses the real-time communication device data and the standard communication device data to perform, in a secondary determining unit, secondary communication device data determining, and if a secondary communication device data determining result is that the real-time communication device data matches the standard communication device data, the secondary communication device data determining result is used as an actual communication device data determining result, and the first communication device data determining result is discarded; or if the secondary communication device data determining result is that the real-time communication device data does not match the standard communication device data, the first communication device data determining result is used as an actual communication device data determining result, the secondary communication device data determining result is discarded, and at the same time, the central control apparatus starts the communication device anomaly alarm apparatus to alarm an anomaly of a communication device.

4. The electromagnetic environment evaluation system for a civil airport and an aviation station according to claim 1, further comprising a meteorological device anomaly alarm apparatus, wherein the central control apparatus uses real-time meteorological device data and standard meteorological device data to perform meteorological device data determining, wherein the central control apparatus uses the real-time meteorological device data and the standard meteorological device data to perform, in a primary determining unit, first meteorological device data determining, and if a first meteorological device data determining result is that the real-time meteorological device data matches the standard meteorological device data, the first meteorological device data determining result is used as an actual meteorological device data determining result; or if the first meteorological device data determining result is that the real-time meteorological device data does not match the standard meteorological device data, the first meteorological device data determining result is temporarily stored; or the central control apparatus uses the real-time meteorological device data and the standard meteorological device data to perform, in a secondary determining unit, secondary meteorological device data determining, and if a secondary meteorological device data determining result is that the real-time meteorological device data matches the standard meteorological device data, the secondary meteorological device data determining result is used as an actual meteorological device data determining result, and the first meteorological device data determining result is discarded; or if the secondary meteorological device data determining result is that the real-time meteorological device data does not match the standard meteorological device data, the first meteorological device data determining result is used as an actual meteorological device data determining result, the secondary meteorological device data determining result is discarded, and at the same time, the central control apparatus starts the meteorological device anomaly alarm apparatus to alarm an anomaly of a meteorological device.

5. The electromagnetic environment evaluation system for a civil airport and an aviation station according to claim 1, further comprising an alternating current anomaly alarm apparatus, wherein the central control apparatus uses real-time alternating current data and standard alternating current data to perform alternating current data determining, wherein the central control apparatus uses the real-time alternating current data and the standard alternating current data to perform, in a primary determining unit, first alternating current data determining, and if a first alternating current data determining result is that the real-time alternating current data matches the standard alternating current data, the first alternating current data determining result is used as an actual alternating current data determining result; or if the first alternating current data determining result is that the real-time alternating current data does not match the standard alternating current data, the first alternating current data determining result is temporarily stored; or the central control apparatus uses the real-time alternating current data and the standard alternating current data to perform, in a secondary determining unit, secondary alternating current data determining, and if a secondary alternating current data determining result is that the real-time alternating current data matches the standard alternating current data, the secondary alternating current data determining result is used as an actual alternating current data determining result, and the first alternating current data determining result is discarded; or if the secondary alternating current data determining result is that the real-time alternating current data does not match the standard alternating current data, the first alternating current data determining result is used as an actual alternating current data determining result, the secondary alternating current data determining result is discarded, and at the same time, the central control apparatus starts the alternating current anomaly alarm apparatus to alarm an alternating current anomaly.

6. The electromagnetic environment evaluation system for a civil airport and an aviation station according to claim 1, further comprising a storage battery anomaly alarm apparatus, wherein the central control apparatus uses real-time storage battery data and standard storage battery data to perform storage battery data determining, wherein the central control apparatus uses the real-time storage battery data and the standard storage battery data to perform, in a primary determining unit, first storage battery determining, and if a first storage battery data determining result is that the real-time storage battery data matches the standard storage battery data, the first storage battery data determining result is used as an actual storage battery data determining result; or if the first storage battery data determining result is that the real-time storage battery data does not match the standard storage battery data, the first storage battery data determining result is temporarily stored; or the central control apparatus uses the real-time storage battery data and the standard storage battery data to perform, in a secondary determining unit, secondary storage battery data determining, and if a secondary storage battery data determining result is that the real-time storage battery data matches the standard storage battery data, the secondary storage battery data determining result is used as an actual storage battery data determining result, and the first storage battery data determining result is discarded; or if the secondary storage battery data determining result is that the real-time storage battery data does not match the standard storage battery data, the first storage battery data determining result is used as an actual storage battery data determining result, the secondary storage battery data determining result is discarded, and at the same time, the central control apparatus starts the storage battery anomaly alarm apparatus to alarm an anomaly of a storage battery.

7. The electromagnetic environment evaluation system for a civil airport and an aviation station according to claim 1, further comprising an anomaly alarm apparatus of air conditioning equipment, wherein the central control apparatus uses real-time air conditioning equipment data and standard air conditioning equipment data to perform air conditioning equipment data determining, wherein the central control apparatus uses the real-time air conditioning, equipment data and the standard air conditioning equipment data to perform, in a primary determining unit, first air conditioning equipment data determining, and if a first air conditioning equipment data determining result is that the real-time air conditioning equipment data matches the standard air conditioning equipment data, the first air conditioning equipment data determining result is used as an actual air conditioning equipment data determining result; or if the first air conditioning equipment data determining result is that the real-time air conditioning equipment data does not match the standard air conditioning equipment data, the first air conditioning equipment data determining result is temporarily stored; or the central control apparatus uses the real-time air conditioning equipment data and the standard air conditioning equipment data to perform, in a secondary determining unit, secondary air conditioning equipment data determining, and if a secondary air conditioning equipment data determining result is that the real-time air conditioning equipment data matches the standard air conditioning equipment data, the secondary air conditioning equipment data determining result is used as an actual air conditioning equipment data determining result, and the first air conditioning equipment data determining result is discarded; or if the secondary air conditioning equipment data determining result is that the real-time air conditioning equipment data does not match the standard air conditioning equipment data, the first air conditioning equipment data determining result is used as an actual air conditioning equipment data determining result, the secondary air conditioning equipment data determining result is discarded, and at the same time, the central control apparatus starts the anomaly alarm apparatus of air conditioning equipment to alarm an anomaly of the air conditioning equipment.

8. The electromagnetic environment evaluation system for a civil airport and an aviation station according to claim 1, further comprising an anomaly alarm apparatus of fire protection equipment, wherein the central control apparatus uses real-time fire protection equipment data and standard fire protection equipment data to perform fire protection equipment data determining, wherein the central control apparatus uses the real-time fire protection equipment data and the standard fire protection equipment data to perform, in a primary determining unit, first fire protection equipment data determining, and if a first fire protection equipment data determining result is that the real-time fire protection equipment data matches the standard fire protection equipment data, the first fire protection equipment data determining result is used as an actual fire protection equipment data determining result; or if the first fire protection equipment data determining result is that the real-time fire protection equipment data does not match the standard fire protection equipment data, the first fire protection equipment data determining result is temporarily stored; or the central control apparatus uses the real-time fire protection equipment data and the standard fire protection equipment data to perform, in a secondary determining unit, secondary fire protection equipment data determining, and if a secondary fire protection equipment data determining result is that the real-time fire protection equipment data matches the standard fire protection equipment data, the secondary fire protection equipment data determining result is used as an actual tire protection equipment data determining result, and the first fire protection equipment data determining result is discarded; or if the secondary tire protection equipment data determining result is that the real-time fire protection equipment data does not match the standard fire protection equipment data, the first fire protection equipment data determining result is used as an actual fire protection equipment data determining result, the secondary fire protection equipment data determining result is discarded, and at the same time, the central control apparatus starts the anomaly alarm apparatus of fire protection equipment to alarm an anomaly of the fire protection equipment.

9. The electromagnetic environment evaluation system for a civil airport and an aviation station according to claim 1, further comprising an anomaly alarm apparatus of a monitoring device, wherein the central control apparatus uses real-time monitoring device data and standard monitoring device data to perform monitoring device data determining, wherein the central control apparatus uses the real-time monitoring device data and the standard monitoring device data to perform, in a primary determining unit, first monitoring device data determining, and if a first monitoring device data determining result is that the real-time monitoring device data matches the standard monitoring device data, the first monitoring device data determining result is used as an actual monitoring device data determining result; or if the first monitoring device data determining result is that the real-time monitoring device data does not match the standard monitoring device data, the first monitoring device data determining result is temporarily stored; or the central control apparatus uses the real-time monitoring device data and the standard monitoring device data to perform, in a secondary determining unit, secondary monitoring device data determining, and if a secondary monitoring device data determining result is that the real-time monitoring device data matches the standard monitoring device data, the secondary monitoring device data determining result is used as an actual monitoring device data determining result, and the first monitoring device data determining result is discarded; or if the secondary monitoring device data determining result is that the real-time monitoring device data does not match the standard monitoring device data, the first monitoring device data determining result is used as an actual monitoring device data determining result, the secondary monitoring device data determining result is discarded, and at the same time, the central control apparatus starts the anomaly alarm apparatus of a monitoring device to alarm an anomaly of the monitoring device.

10. The electromagnetic environment evaluation system for a civil airport and an aviation station according to claim 1, further comprising an anti-theft system anomaly alarm apparatus, wherein the central control apparatus uses real-time anti-theft system data and standard anti-theft system data to perform anti-theft system data determining, wherein the central control apparatus uses the real-time anti-theft system data and the standard anti-theft system data to perform, in a primary determining unit, first anti-theft system data determining, and if a first anti-theft system data determining result is that the real-time anti-theft system data matches the standard anti-theft system data, the first anti-theft system data determining result is used as an actual anti-theft system data determining result; or if the first anti-theft system data determining result is that the real-time anti-theft system data does not match the standard anti-theft system data, the first anti-theft system data determining result is temporarily stored; or the central control apparatus uses the real-time anti-theft system data and the standard anti-theft system data to perform, in a secondary determining unit, secondary anti-theft system data determining, and if a secondary anti-theft system data determining result is that the real-time anti-theft system data matches the standard anti-theft system data; the secondary anti-theft system data determining result is used as an actual anti-theft system data determining result, and the first anti-theft system data determining result is discarded; or if the secondary anti-theft system data determining result is that the real-time anti-theft system data does not match the standard anti-theft system data, the first anti-theft system data determining result is used as an actual anti-theft system data determining result, the secondary anti-theft system data determining result is discarded, and at the same time, the central control apparatus starts the anti-theft system anomaly alarm apparatus to alarm an anomaly of the anti-theft system.

* * * * *